United States Patent [19]

Sparks

[11] Patent Number: 5,212,784
[45] Date of Patent: May 18, 1993

[54] AUTOMATED CONCURRENT DATA BACKUP SYSTEM

[75] Inventor: Clyde R. Sparks, Riverside, Calif.

[73] Assignee: Delphi Data, a Division of Sparks Industries, Inc., Corona, Calif.

[21] Appl. No.: 601,251

[22] Filed: Oct. 22, 1990

[51] Int. Cl.[5] .............................................. G06F 11/20
[52] U.S. Cl. ............................. 395/575; 364/DIG. 1; 364/268.5; 364/285.1; 371/10.1
[58] Field of Search ................ 371/10.1, 9.1; 395/575; 364/268.1, 268.5, 269.3, 285.1

[56] References Cited

U.S. PATENT DOCUMENTS

| | | | |
|---|---|---|---|
| 4,530,048 | 7/1985 | Proper | 364/200 |
| 4,819,154 | 4/1989 | Stiffler et al. | 364/200 |
| 5,086,502 | 2/1992 | Malcolm | 395/575 |
| 5,109,505 | 4/1992 | Kihara | 395/575 |

Primary Examiner—Charles E. Atkinson
Attorney, Agent, or Firm—Spensley Horn Jubas & Lubitz

[57] ABSTRACT

An automated concurrent data backup system and method. The architecture of the present invention includes a CPU coupled to a primary controller. The primary controller is coupled by separate logical buses to at least a set of paired mirrored or shadowed primary data storage devices. On one of the logical buses, a backup device controller is attached. Attached to the backup device controller is a backup device. In normal operation, the primary controller writes data to both of the primary data storage devices. When a backup is desired, the primary controller is programmed to detect a specified "trigger" signal from the CPU. The primary controller stops writing data from the CPU to both of the primary data storage devices. The backup device controller becomes the "bus master" over one of the logical buses, in known fashion, and starts a backup operation with respect to the data stored on the primary storage device designated for being backed up. In effect, control of the designated primary data storage device has been turned over to a new controller, the backup device controller, after the primary controller has "switched off" its control of the connecting logical bus. The backup device controller transfers the data that it reads from the designated primary data storage device to the backup storage device. The primary controller then again becomes the "bus master" of the previously disconnected logical bus. The primary controller then resynchronizes the primary data storage devices so that data that has been written on the continuously operational data storage device is copied onto the designated data storage device. In an alternative embodiment, the primary controller is coupled by separate logical buses to at least a set of triplet or quadruplet mirrored or shadowed primary data storage devices. Triplet devices permit backup operation while retaining the redundancy characteristic of mirrored storage devices. Quadruplet devices permit continuous backup operation of two alternating storage devices while retaining the redundancy characteristic of mirrored storage devices.

21 Claims, 3 Drawing Sheets

AUTOMATED CONCURRENT DATA BACKUP SYSTEM

BACKGROUND OF THE INVENTION

1. Field of the Invention

This invention relates to computer peripheral storage device backup systems, and more particularly to an automated concurrent data backup system and method.

2. Description of Related Art

It is common practice in the computer industry to provide a backup data storage device, such as a tape drive, for making a duplicate copy of data on one or more other storage devices, such as magnetic disk drives. Backup copies provide security in case of failure of the primary data storage device, and archive copies of data files for tracing previous generations of data.

As primary data storage devices increase in data storage capacity (for example, magnetic disk drives holding more than one gigabyte of data are currently available), the time required to make a complete backup of such devices has also increased. Some systems have grown to such a capacity that it takes more than a day to backup a day's worth of accumulated data. In some installations, backups are done overnight, or even over a weekend, simply in order to have enough time to make a complete backup copy of the data on the primary data storage devices.

In many areas of industry, it is important to have virtually daily backups of data. For example, in the hospital services field, it is important to have patient clinical and billing data backed up on a daily basis so that no more than a day's worth of data can be lost if a failure occurs in the primary data storage system.

In critical applications, computer systems often have multiple data storage devices coupled through a controller to a computer and operated in a "mirrored" or "shadowed" configuration. In a "mirrored" configuration, data storage devices are treated as pairs, and all data intended for a particular data storage device is duplicated on a block for block basis on the paired "mirror" data storage device. Shadowing is similar, except that logical blocks rather than physical blocks are duplicated on paired "shadow" drives. The principal purpose of mirroring or shadowing data storage devices is to be able to continue processing with the redundant data storage device if one of a mirrored pair of storage devices fails. Mirroring and/or shadowing can be accomplished by special circuitry or by computer program control, or by a combination thereof.

For a computer system having mirrored or shadowed primary data storage devices, it would be desirable to provide a means and method that could copy a primary data storage device to a backup data storage device without interrupting processing, or without requiring an extraordinary amount of time. It would also be desirable to provide such a means and method that did not require changes to the operating system of the computer.

The present invention provides such a means and method for computing systems having mirrored or shadowed primary data storage devices.

SUMMARY OF THE INVENTION

The architecture of the present invention includes a central processing unit ("CPU") coupled to a primary controller. The primary controller is coupled by separate logical buses to at least a set of paired mirrored or shadowed primary data storage devices. The logical buses are preferably "intelligent" buses that uses command packets and response packets transmitted over the bus, rather than direct low-level storage device control signals. On one of the logical buses, a backup device controller is attached. Attached to the backup device controller is a backup device (e.g., a reel-to-reel tape drive, cartridge tape drive, or optical storage system).

In normal operation, the primary controller writes data to both of the primary data storage devices. In general, the data on the pair of primary storage devices is identical. If either primary data storage device were to fail, the other primary storage device would be available for continued operation of the computer system CPU.

When a backup is desired, the primary controller is programmed to detect a specified "trigger" signal from the CPU. The primary controller stops writing data from the CPU to both of the primary data storage devices. The backup device controller becomes the "bus master" over one of the logical buses, in known fashion, and starts the backup operation with respect to the data stored on the primary storage device designated for being backed up. The designated primary data storage device responds in normal fashion to the commands of the backup device controller, which are in the same format as commands received from the primary controller. In effect, control of the designated primary data storage device has been turned over to a new controller, the backup device controller, after the primary controller has "switched off" its control of the connecting logical bus.

The backup device controller transfers the data that it reads from the designated primary data storage device to the backup storage device. At the end of the backup operation, the backup device controller signals that it is finished to the primary controller. The primary controller then again becomes the "bus master" of the previously disconnected logical bus. The primary controller then resynchronizes the primary data storage devices so that data that has been written on the continuously operational data storage device is copied onto the designated data storage device.

In an alternative embodiment, the primary controller is coupled by separate logical buses to at least a set of triplet or quadruplet mirrored or shadowed primary data storage devices. Triplet devices permit backup operation while retaining the redundancy characteristic of mirrored storage devices. Quadruplet devices permit continuous backup operation of two alternating storage devices while retaining the redundancy characteristic of mirrored storage devices.

The details of the preferred embodiment of the present invention are set forth below. Once the details of the invention are known, numerous additional innovations and changes will become obvious to one skilled in the art.

DESCRIPTION OF THE DRAWINGS

Like numbers and designations in the drawings refer to like elements.

DETAILED DESCRIPTION OF THE INVENTION

Throughout this description, the preferred embodiment and examples shown should be considered as exemplars, rather than limitations on the method of the present invention.

Figure 1:
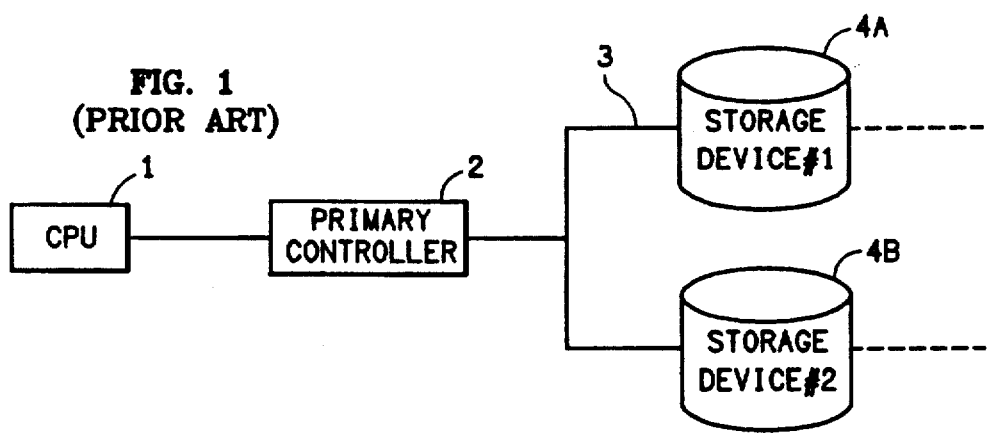
FIG. 1 is a block diagram of a prior art computer system having a mirrored or shadowed pair of primary storage devices.

FIG. 1 shows a block diagram of the basic architecture of a prior art computer system having mirrored or shadowed primary data storage devices. A CPU 1 is coupled to a primary controller 2. The primary controller 2 is in turn coupled by means of a bus 3 to paired primary data storage devices (e.g., magnetic disk drives) 4A, 4B. Although only two primary data storage devices 4A, 4B are shown, the art encompasses a plurality of paired sets of primary data storage devices (indicated by the dotted lines in FIG. 1).

In the prior art, to backup the data on either primary data storage device 4A, 4B, it has been necessary for the primary controller 2 to cease communicating data between itself and the CPU 1, and instead oversee transference of data from either one of the primary data storage devices 4A, 4B to a backup device system (e.g., a reel-to-reel tape drive, cartridge tape drive, or optical storage device). The CPU 1 is effectively shutdown in order to backup the data on one of the primary data storage devices 4A, 4B.

Figure 2:
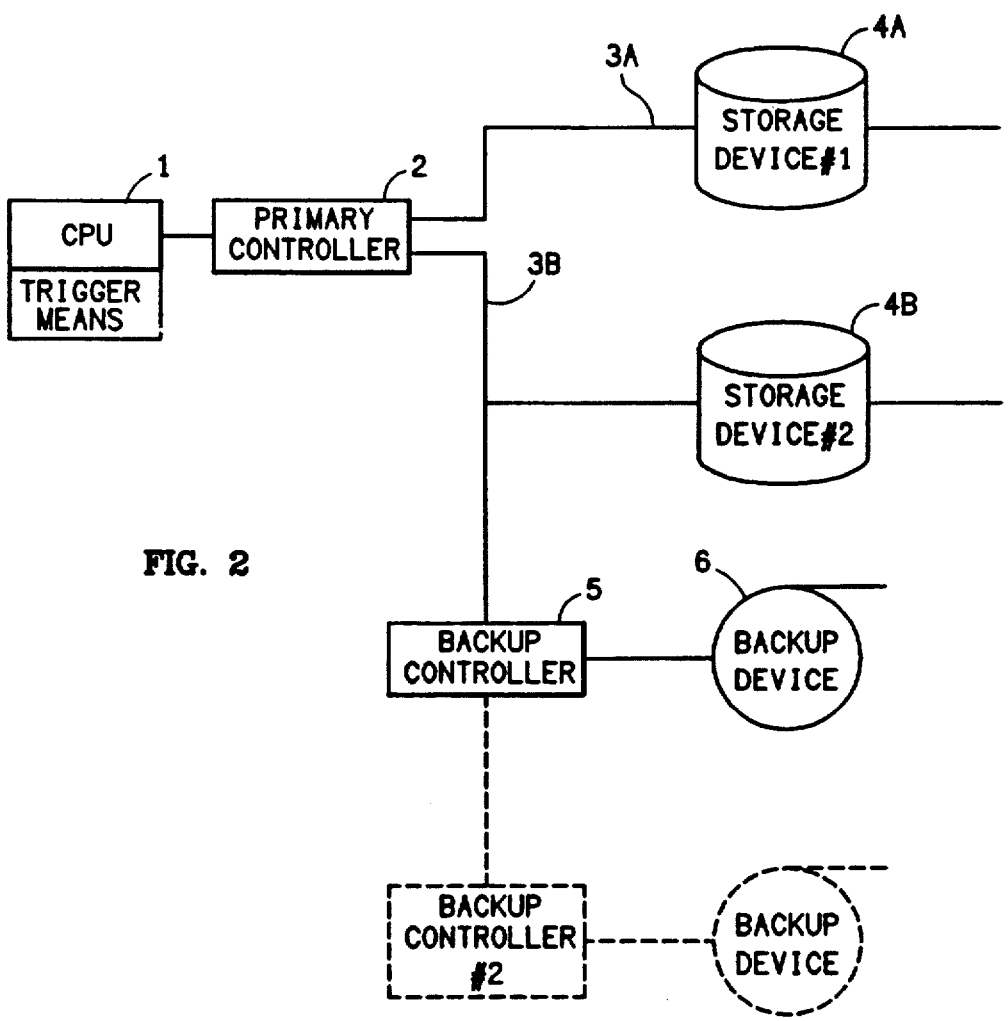
FIG. 2 is a block diagram of the preferred embodiment of the present invention.

FIG. 2 shows the preferred architecture of the present invention, again showing a CPU 1 coupled to a primary controller 2. However, in the present invention, the primary controller 2 is coupled by separate logical buses 3A, 3B to at least a set of paired mirrored or shadowed primary data storage devices 4A, 4B. Although only two primary data storage devices 4A, 4B are shown, the art encompasses a plurality of paired sets of primary data storage devices (indicated by the dotted lines in FIG. 2). In an alternative embodiment, the primary controller 2 is coupled by separate logical buses to at least a set of triplet or quadruplet mirrored or shadowed primary data storage devices. Triplet devices permit backup operation while retaining the redundancy characteristic of mirrored storage devices. Quadruplet devices permit continuous backup operation of two alternating storage devices while retaining the redundancy characteristic of mirrored storage devices.

Two physical buses are shown in FIG. 2 as the preferable form of the logical buses 3A, 3B. Performance of the system is not degraded if two physical buses are used. However, the invention encompasses a single physical bus that may be treated as logically separate buses in a "time-sharing" manner, in known fashion, but with some resulting reduction in input/output bandwidth.

The logical buses 3A, 3B are preferably "intelligent" buses, such as the well-known Small Computer Storage Interface ("SCSI") or Intelligent Peripheral Interface ("IPI") buses. Such a bus has the advantages that command packets and response packets are transmitted over the bus, rather than direct low-level storage device control signals. Consequently, devices coupled to such a bus have an "intelligent" interface between the device and the bus, capable of accepting command packets and generating response packets by means of internal programming.

In addition, on one of the logical buses (for example, bus 3B), a backup device controller 5 is attached. For example, if the logical bus 3B is a SCSI bus, the backup device controller 5 would be SCSI-compatible. Attached to the backup device controller 5 is at least one backup device 6 (e.g., reel-to-reel tape drive(s), cartridge tape drive(s), or optical storage unit(s)).

In normal operation, the primary controller 2 writes data to both of the primary data storage devices 4A, 4B, in accordance with known mirroring or shadowing procedures. Thus, in general, the data on primary storage device 4A is identical to the data on primary storage device 4B. If either primary data storage device 4A, 4B were to fail, the other primary storage device would be available for continued operation of the computer system CPU 1.

Figure 3:
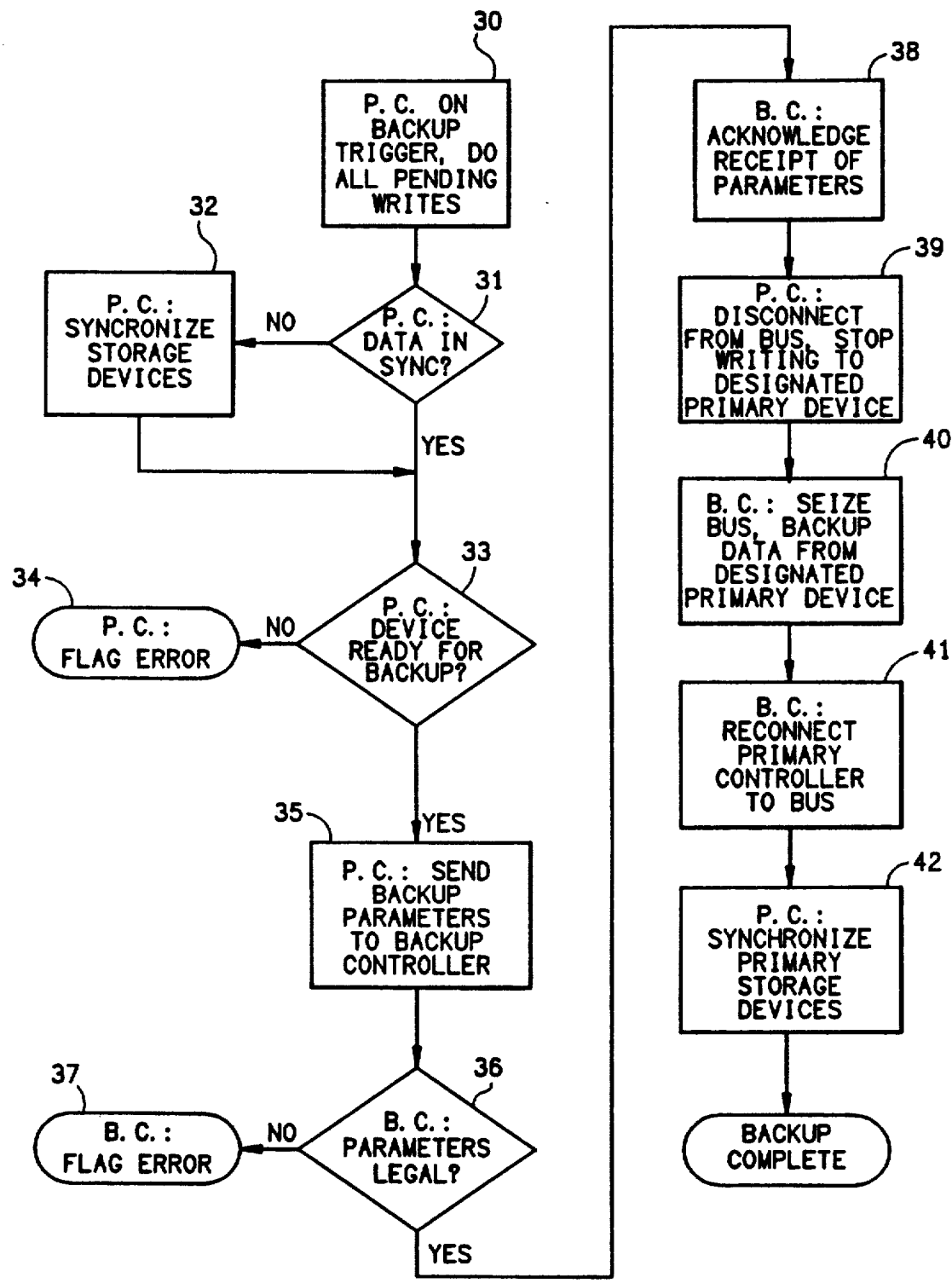
FIG. 3 is a flowchart of a backup operation in accordance with the preferred embodiment of the present invention.

FIG. 3 is a flowchart of a typical backup operation in accordance with the preferred embodiment of the present invention. Reference to "Steps" in the description that follows are to FIG. 3.

Under the present invention, when a backup is desired, the primary controller 2 is programmed to detect a specified "trigger" signal. The trigger signal may be generated by the CPU 1, which can be programmed to generate a specific backup command, or provide a means (such as a memory resident program) for a user to specify a specific backup command. In the preferred embodiment of the invention, it is preferable to use an existing user-controllable command or signal capable of being generated by the CPU 1 as the trigger signal. For example, the trigger signal can be an Input/Output Reset signal, a Test Unit Ready signal, or a Rewind-/Reinitialize command. Using an existing command inherent in the operating system of the CPU 1 has the advantage of not requiring a memory resident program or modification to the operating system of the CPU 1.

Other trigger signals that can be used are external electrical switches, detection of a signal from another device (such as an uninterruptable power supply coupled to the CPU 1 and/or the primary controller 2, so that a backup will commence if power is lost to the CPU 1, or such as a modem, so that a backup will commence upon receipt of a remote-origin command), an internal or external clock (so that backups may automatically commence at a preset time), an operation or operational state (such as a SEEK command to a specific disk sector, or the existence of a particular CPU or bus state, so that backups may automatically commence upon such an occurrence).

Once the trigger signal is sensed, the primary controller 2 completes all pending WRITE commands to the primary data storage devices 4A, 4B, in known fashion (Step 30). In the preferred embodiment of the invention, the primary controller 2 then confirms that the mirrored primary data storage devices 4A, 4B in fact are in synchronization (i.e., that all data on each data storage device is also on the other data storage device) (Step 31). This may be done by checking a status byte maintained in the primary controller 2 which gives an indication as to when a pair of primary data storage devices 4A, 4B has fallen out of synchronization. In accordance with an option preset by a user, if the primary data storage devices 4A, 4B are not in synchronization, the primary controller 2 synchronizes them, in known fashion (Step 32). The primary controller 2 then continues the backup process in accordance with the present invention.

The primary controller 2 also confirms that the "designated" primary data storage device (the data storage device 4B coupled to the same logical bus 3B as the backup device controller 5) is operational and capable of having data read from it (Step 33). If the designated primary data storage device 4B is not operational, an error flag is set (Step 34), which may be handled as desired by the CPU 1.

If the designated primary data storage device 4B is properly operating, the primary controller 2 sends a command packet to the backup device controller 5 containing the command parameters necessary for the backup device controller 5 to request data blocks from the designated primary data storage device 4B (Step 35). Such command parameters would typically include, for example, a drive identification code, a beginning block number, the number of blocks to transfer, and whatever other information may be necessary to implement the standard intelligent bus protocol used over the logical bus 3B.

In the preferred embodiment of the invention, the backup device controller 5 checks to see if the parameter information received from the primary controller 2 contains valid commands in a valid format, according to predefined programmed standards (Step 36). If an error is detected, the backup device controller 5 flags the error and does not perform the backup operation (Step 37). If the received command parameters are valid, the backup device controller 5 sends a response packet to the primary controller 2 acknowledging receipt of the command parameters (Step 38).

Upon receipt of the acknowledging response packet from the backup device controller 5, the primary controller 2 stops mirroring data from the CPU 1 to both of the primary data storage devices 4A, 4B (Step 39). In the preferred embodiment, the primary controller 2 sends a COPY command to the backup device controller 5. The primary controller 2 also releases control of the logical bus 3B to which the designated primary data storage device 4B and the backup device controller 5 are coupled by issuing a "DISCONNECT" command, in known fashion (Step 39). Thereafter, during the subsequent backup process, the primary controller 2 is disabled from transferring data to and from the designated primary data storage device 4B, but is enabled to operate in normal fashion in terms of reading data from and writing data to the redundant primary storage device 4A and communicating data between itself and the CPU 1.

The backup device controller 5 interprets the COPY command as an instruction to seize control (become the "bus master", in known fashion) of the logical bus 3B coupling the backup device controller 5 to the designated primary data storage device 4B. The backup device controller 5 then starts a COPY operation with respect to the data stored on the designated primary storage device 4B (Step 40). That is, using the command parameter information received from the primary controller 2, the backup device controller 5 begins reading data from the designated primary backup device 4B, beginning at the designated block number and reading for a designated number of blocks. The designated primary data storage device 4B responds in normal fashion to the commands of the backup device controller 5, which are in the same format as commands received from the primary controller 2. In effect, control of the designated primary data storage device 4B has been turned over to a new controller, the backup device controller 5, after the primary controller 2 has "switched off" its control of the logical bus 3B.

The backup device controller 5 transfers the data that it reads from the designated primary data storage device 4B to the backup storage device or devices 6. At the end of the COPY operation, the backup device controller 5 signals that it is finished to the primary controller 2, and releases control of the logical bus 3B. This may, for example, be done by means of a RECONNECT command, in known fashion (Step 41). The primary controller 2 again becomes the "bus master" of the previously disconnected logical bus 3B. The primary controller 2 then resynchronizes the primary data storage devices 4A, 4B so that data that has been written on the continuously operational data storage device 4A is copied onto the designated data storage device 4B (Step 42). Re-synchronization can be done in a number of known ways.

Re-synchronization time is generally improved by maintaining a bitmap of data blocks or sectors on the continuously operational data storage device 4A that were changed during the backup procedure. After the backup operation completes, such a bitmap is used to rapidly copy the changed data blocks or sectors from the continuously operational data storage device 4A to the designated data storage device 4B. Re-synchronization proceeds very quickly because the data transfer rate between primary data storage devices is generally much faster than the data transfer rate between a primary data storage device and a backup data storage device.

Thus, by use of a dual-logical bus structure and a trigger signal, the present invention permits automatic backup of sets of mirrored or shadowed primary data storage devices completely transparently to normal operation. All disk operations continue without interruption.

Figure 2A:
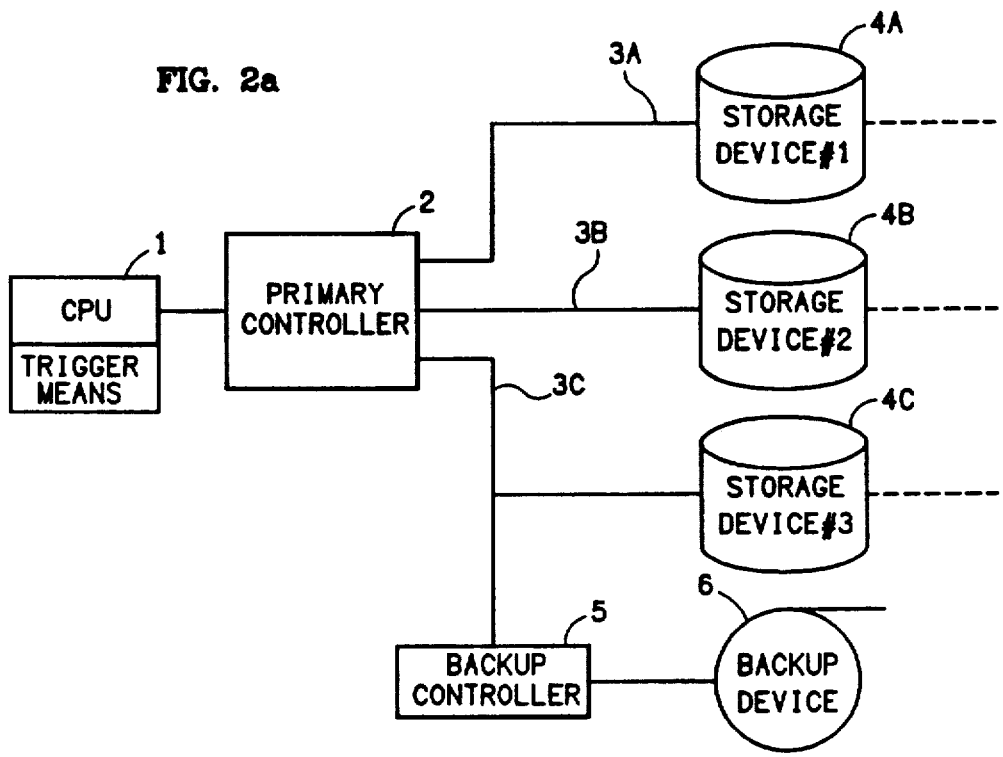
FIG. 2a is a block diagram of a first alternative embodiment of the present invention.
Figure 2B:
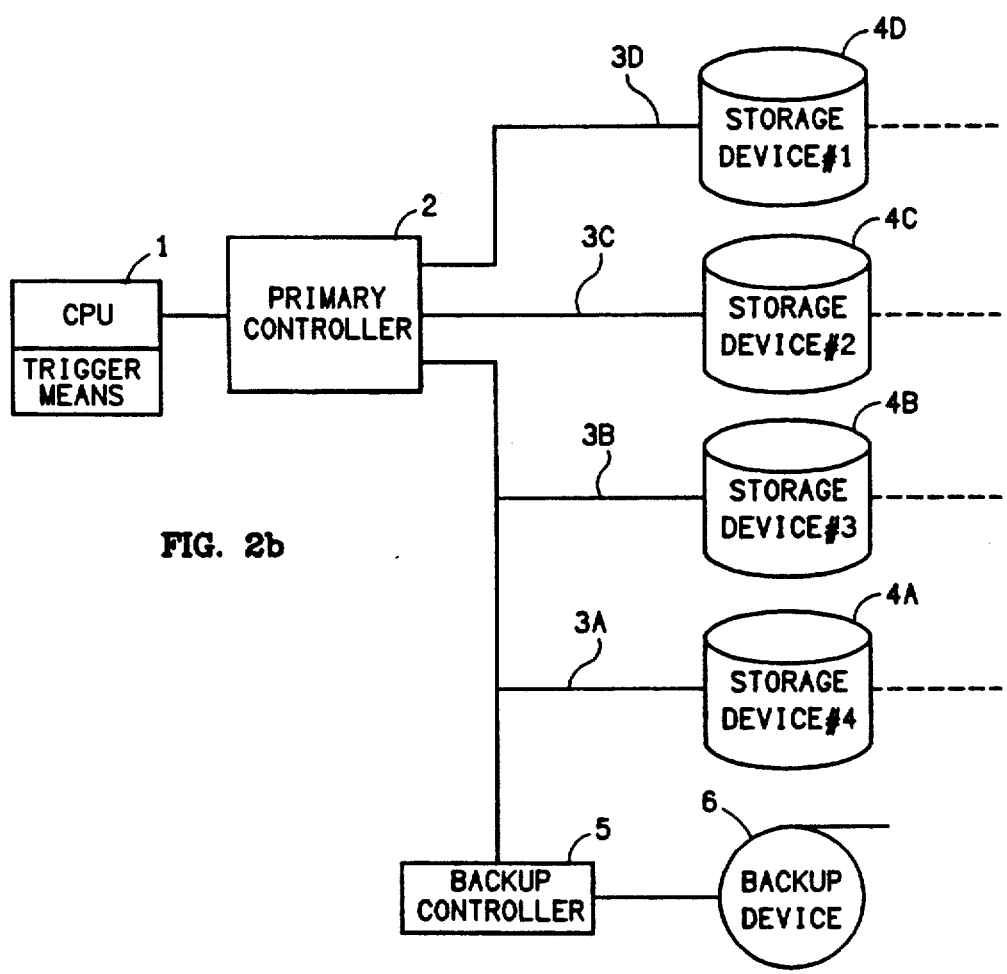
FIG. 2b is a block diagram of a second alternative embodiment of the present invention.

If additional reliability and security are desired, the primary controller 2 is coupled by separate logical buses to three or four primary data storage devices (rather than two) in each set of mirrored or shadowed storage devices, as shown in FIGS. 2a and 2b, respectively. When a backup operation commences, one of the data storage devices is disconnected from the primary controller 2 and connected to a backup device controller 5, as described above. The primary controller 2 continues to mirror or shadow data between the two or three remaining primary data storage devices. This redundancy permits backing up a large volume of data, while retaining the security of continued operation if one of the mirrored or shadowed primary data storage devices fails.

Triplet primary storage devices permit backup operation of one device while retaining the redundancy characteristic of paired mirrored storage devices. Quadruplet primary storage devices permit continuous backup operation of two alternating storage devices while retaining the redundancy characteristic of paired mirrored storage devices. That is, when one primary storage device is designated for backup (e.g., 4A), it is disconnected from the primary controller 2 and connected to a backup device controller 5, as described above. The primary controller 2 continues to mirror or shadow data between the three remaining primary data storage devices (e.g., 4B, 4C, and 4D). When backup of the designated primary storage device 4A is completed, it is re-synchronized with a pair of the primary storage devices (e.g., 4C and 4D). Meanwhile, the remaining primary storage device 4B becomes the designated primary storage device, and is disconnected from the primary controller 2 and connected to a backup device controller 5, as described above. This arrangement means that backups are basically continuously performed in an "A-B" manner, so that the saved data is no older than the time required to backup a first designated storage device or to re-synchronize a second designated storage device (whichever is longer, since such operations are concurrently performed).

Additional configurations encompassed within the scope of the present invention include coupling more than one backup device controller 5 to the logical bus 3B coupled to the designated primary data storage device 4B (indicated by the dotted line in FIG. 2 from backup device controller 5). Such additional backup devices controllers would be coupled to additional backup devices. Such redundancy would permit making multiple backup copies simultaneously.

Moreover, because the backup device controller 5 completely controls the operation of reading data from the designated primary data storage device 4B and transmitting that data to a backup device 6, a number of options are available for configuration of the system. For example, the backup device 6 itself need not be in close physical proximity to the backup device controller 5. If desired, the backup device 6 can be placed in a secure environment, with data transmitted to it via long-distance wired connection (e.g., a local area network, modem telecommunications, or transmission lines) or a wireless communication system. Such a configuration would permit transmitting backup data off-site immediately, rather than backing up the data on-site and transporting the backup media (e.g., tape reel, cartridge, or optical disk) off-site for security purposes.

A number of embodiments of the present invention have been described. Nevertheless, it will be understood that various modifications may be made without departing from the spirit and scope of the invention. For example, the backup controller 5 may compress and/or encrypt data before writing the data to the backup device 6. Suitable compression and encryption algorithms and/or circuits are well-known in the art. The backup controller 5 may also provide for automatic labeling and/or time-stamping of each backup copy made by the backup device 6. Accordingly, it is to be understood that the invention is not to be limited by the specific illustrated embodiment, but only by the scope of the appended claims.

I claim:

1. An automated concurrent data backup system including:
   a. a central processing unit;
   b. at least one first primary data storage device coupled to a first controllable logical bus;
   c. at least one second primary data storage device coupled to a second controllable logical bus;
   d. trigger generation means for generating a trigger signal;
   e. primary controller means, coupled to the central processing unit, the trigger generation means, and to each first primary data storage device by the first logical bus and to each second primary data storage device by the second logical bus, the primary controller means for:
      (1) controlling data transfers between the central processing unit and at least one pair of the first and second primary data storage devices, wherein each such at least one pair of first and second primary data storage device contains approximately the same data; and
      (2) automatically detecting the trigger signal, and generating a backup command over at least the second logical bus in response to such detection;
   f. backup storage means;
   g. first backup controller means, coupled to the second logical bus and the backup storage means, for detecting the backup command generated from the primary controller means, seizing control of the second logical bus, transferring selected data from at least one second primary data storage device to the backup storage means, and thereafter releasing control of the second logical bus to the primary controller means;
   wherein data transfers between the central processing unit and at least one first primary data storage device are enabled, and data transfers between the central processing unit and each second primary data storage device are disabled, while control of the second logical bus is seized by the first backup controller means.

2. An automated concurrent data backup system for use with a central processing unit, at least one first primary data storage device coupled to a first controllable logical bus, and at least one second primary data storage device coupled to a second controllable logical bus, the backup system including:
   a. trigger generation means for generating a trigger signal;
   b. primary controller means, coupled to the central processing unit, the trigger generation means, and to each first primary data storage device by the first logical bus and to each second primary data storage device by the second logical bus, the primary controller means for:
      (1) controlling data transfers between the central processing unit and at least one pair of the first and second primary data storage devices, wherein each such at least one pair of first and second primary data storage device contains approximately the same data; and
      (2) automatically detecting the trigger signal, and generating a backup command over at least the second logical bus in response to such detection;
   c. backup storage means;
   d. first backup controller means, coupled to the second logical bus and the backup storage means, for detecting the backup command generated from the primary controller means, seizing control of the second logical bus, transferring selected data from at least one second primary data storage device to the backup storage means, and thereafter releasing control of the second logical bus to the primary controller means;
   wherein data transfers between the central processing unit and at least one first primary data storage device are enabled, and data transfers between the central processing unit and each second primary data storage device are disabled, while control of the second logical bus is seized by the first backup controller means.

3. The automated concurrent data backup system of claims 1 or 2, wherein the trigger signal is generated following the occurrence of an existing command of the central processing unit.

4. The automated concurrent data backup system of claims 1 or 2, wherein the trigger signal is generated following the occurrence of an electronic signal generated external to the backup system.

5. The automated concurrent data backup system of claims 1 or 2, wherein the trigger signal is generated following the occurrence of an operational state of the system.

6. The automated concurrent data backup system of claims 1 or 2, wherein the trigger signal is generated at a preset time.

7. The automated concurrent data backup system of claims 1 or 2, wherein the primary controller means is further for completing all data transfers from the central processing unit to the first and second primary data storage devices after detection of the trigger signal.

8. The automated concurrent data backup system of claims 1 or 2, wherein the primary controller means is further for synchronizing the data on the first and second primary data storage devices after detection of the trigger signal.

9. The automated concurrent data backup system of claims 1 or 2, wherein the primary controller means is further for synchronizing the data on the first and second primary data storage devices after control of the second logical bus is returned to the primary controller means.

10. The automated concurrent data backup system of claims 1 or 2, further including at least a second backup controller means coupled to an associated backup storage means.

11. The automated concurrent data backup system of claims 1 or 2, further including at least one third primary storage device coupled to the primary controller means by a third controllable logical bus, wherein data transfers between the central processing unit and at least one third primary data storage device are enabled while control of the second logical bus is seized by the first backup controller means.

12. The automated concurrent data backup system of claim 11, further including at least one fourth primary storage device coupled to the primary controller means by a fourth controllable logical bus, and wherein the first backup controller means is coupled to the fourth logical bus, and includes means for seizing control of the fourth logical bus, transferring selected data from at least one fourth primary data storage device to the backup storage means, and thereafter releasing control of the fourth logical bus to the primary controller means, wherein the backup controller means alternates seizing control of the second and fourth logical buses, and wherein data transfers between the central processing unit and each fourth primary data storage device are disabled while control of the fourth logical bus is seized by the first backup controller means.

13. A method for automated concurrent data backup in a system including (1) a central processing unit, (2) at least one first primary data storage device coupled to a first controllable logical bus, (3) at least one second primary data storage device coupled to a second controllable logical bus, (4) primary controller coupled to the central processing unit and to each first primary data storage device by the first logical bus and to each second primary data storage device by the second logical bus, (5) at least one backup storage device, and (6) at least one backup controller coupled to the second logical bus and to at least one backup storage means, the backup method including the steps of:

a. controlling data transfers between the central processing unit and at least one pair of the first and second primary data storage devices, wherein each such at least one pair of first and second primary data storage device contains approximately the same data;

b. generating a trigger signal when a backup is to be performed;

c. automatically detecting the trigger signal and generating a backup command over at least the second logical bus in response to such detection;

d. detecting the backup command in at least one backup controller, at least one backup controller thereupon:
  (1) seizing control of the second logical bus;
  (2) transferring selected data from at least one second primary data storage device to at least one backup storage device; and
  (3) thereafter releasing control of the second logical bus to the primary controller;

e. enabling data transfers between the central processing unit and at least one first primary data storage device, and disabling data transfers between the central processing unit and each second primary data storage device, while control of the second logical bus is seized by at least one backup controller.

14. A method for automated concurrent data backup in a system including (1) a central processing unit, (2) at least one first primary data storage device, (3) at least one second primary data storage device, (4) primary controller coupled to the central processing unit, the backup method including the steps of:

a. providing a first controllable logical bus between the primary controller and the first primary data storage device;

b. providing a second controllable logical bus between the primary controller and the second primary data storage device;

c. providing at least one backup storage device;

d. providing at least one backup controller, each coupled to the second logical bus and at least one backup storage device;

e. controlling data transfers between the central processing unit and at least one pair of the first and second primary data storage devices, wherein each such at least one pair of first and second primary data storage device contains approximately the same data;

f. generating a trigger signal when a backup is to be performed;

g. automatically detecting the trigger signal and generating a backup command over at least the second logical bus in response to such detection;

h. detecting the backup command in at least one backup controller, at least one backup controller thereupon:
  (1) seizing control of the second logical bus;
  (2) transferring selected data from at least one second primary data storage device to at least one backup storage device; and
  (3) releasing control of the second logical bus to the primary controller;

i. enabling data transfers between the central processing unit and at least one first primary data storage device, and disabling data transfers between the central processing unit and each second primary data storage device, while control of the second logical bus is seized by at least one backup controller.

15. The method for automated concurrent data backup of claims 13 or 14, wherein the trigger signal is generated following the occurrence of an existing command of the central processing unit.

16. The method for automated concurrent data backup of claims 13 or 14, wherein the trigger signal is generated following the occurrence of an electronic signal generated external to the backup system.

17. The method for automated concurrent data backup of claims 13 or 14, wherein the trigger signal is generated following the occurrence of an operational state of the system.

18. The method for automated concurrent data backup of claims 13 or 14, wherein the trigger signal is generated at a preset time.

19. The method for automated concurrent data backup of claims 13 or 14, further including the step of completing all data transfers from the central processing unit to the first and second primary data storage devices after detection of the trigger signal.

20. The method for automated concurrent data backup of claims 13 or 14, further including the step of synchronizing the data on the first and second primary data storage devices after detection of the trigger signal.

21. The method for automated concurrent data backup of claims 13 or 14, further including the step of synchronizing the data on the first and second primary data storage devices after control of the second logical bus is returned to the primary controller.

* * * * *